(12) United States Patent
Ito

(10) Patent No.: US 7,086,018 B2
(45) Date of Patent: Aug. 1, 2006

(54) ELECTRONIC CIRCUIT DESIGN METHOD, SIMULATION APPARATUS AND COMPUTER-READABLE STORAGE MEDIUM

(75) Inventor: Noriyuki Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 304 days.

(21) Appl. No.: 10/456,679

(22) Filed: Jun. 9, 2003

(65) Prior Publication Data

US 2003/0237066 A1 Dec. 25, 2003

(30) Foreign Application Priority Data

Jun. 19, 2002 (JP) .............................. 2002-177990

(51) Int. Cl.
*G06F 17/50* (2006.01)

(52) U.S. Cl. .............................................. 716/4; 716/5

(58) Field of Classification Search .................... 716/4, 716/5
See application file for complete search history.

(56) References Cited

U.S. PATENT DOCUMENTS

| | | | | |
|---|---|---|---|---|
| 5,502,644 A | * | 3/1996 | Hamilton et al. ............... | 716/5 |
| 6,028,989 A | * | 2/2000 | Dansky et al. ................ | 716/8 |
| 6,058,256 A | * | 5/2000 | Mellen et al. ................ | 716/12 |
| 6,449,753 B1 | * | 9/2002 | Aingaran et al. ............... | 716/5 |
| 6,499,131 B1 | * | 12/2002 | Savithri et al. ................ | 716/5 |
| 6,711,726 B1 | * | 3/2004 | Hirakimoto et al. ........... | 716/10 |

FOREIGN PATENT DOCUMENTS

| | | |
|---|---|---|
| JP | 5-143688 | 6/1993 |
| JP | 5-181938 | 7/1993 |
| JP | 9-045775 | 2/1997 |
| JP | 10-256376 | 9/1998 |

OTHER PUBLICATIONS

Tilmann Stöhr, Markus Hetzel, Jürgen Koehl Analysis, Reduction and Avoidance of Crosstalk on VLSI Chips pp. 211-218.

* cited by examiner

*Primary Examiner*—Vuthe Siek
*Assistant Examiner*—Tuyen To
(74) *Attorney, Agent, or Firm*—Arent Fox PLLC (57) ABSTRACT

An electronic circuit designing method analyzes noise with respect to a wiring pair, and automatically corrects the wiring pair by determining a spacing between wirings of the wiring pair so as to prevent generation of a noise error, if the noise error is detected based on the analysis of the noise.

15 Claims, 10 Drawing Sheets

```
****** Noise Check Error List ******   (99/12/22  17:46:11)

(99/12/22  17:46:11)

CHIP Name    : CHIP
========================================================================
NET Name : net_a        : OTHERS    *Lx1 = 0.37100   Grid
========================================================================
         : net_b        : OTHERS     Lx1 = 0.47829   2530
========================================================================
NET Name : net_b        : OTHERS    *Lx1 = 0.37100   Grid
========================================================================
         : net_a        : OTHERS     Lx1 = 0.47962   2530
========================================================================
NET Name : net_c        : OTHERS    *Lx1 = 0.37100   Grid
========================================================================
         : net_d        : OTHERS     Lx1 = 0.57033   2068
========================================================================
NET Name : net_e        : OTHERS    *Lx1 = 0.37100   Grid
========================================================================
         : net_f        : OTHERS     Lx1 = 0.58460   2044
========================================================================
NET Name : net_g        : OTHERS    *Lx1 = 0.37100   Grid
========================================================================
         : net_h        : OTHERS     Lx1 = 0.46252   1686
========================================================================
NET Name : net_i        : OTHERS    *Lx1 = 0.37100   Grid
========================================================================
         : net_j        : OTHERS     Lx1 = 0.52104   2475
========================================================================
```

ELECTRONIC CIRCUIT DESIGN METHOD, SIMULATION APPARATUS AND COMPUTER-READABLE STORAGE MEDIUM

BACKGROUND OF THE INVENTION

This application claims the benefit of a Japanese Patent Application No. 2002-177990 filed Jun. 19, 2002, in the Japanese Patent Office, the disclosure of which is hereby incorporated by reference.

1. Field of the Invention

The present invention generally relates to electronic circuit design methods, simulation apparatuses and computer-readable storage media, and more particularly to an electronic circuit design method which is suited for automatically carrying out a high-speed wiring process, a simulation apparatus which uses such an electronic circuit designing method, and a computer-readable storage medium which stores a program for causing a computer to design an electronic circuit using such an electronic circuit design method.

2. Description of the Related Art

When designing electronic circuits such as a large scale integrated (LSI) circuits, multi chip modules (MCMs) and printed circuit boards (PCBs) by computer aided design (CAD), a noise analysis is carried out by simulation and noise countermeasures are taken with respect to the noise depending on the results of the noise analysis. The noise analyzed by the noise analysis includes reflection noise and crosstalk noise. The reflection noise is generated due to mismatch of characteristic impedances of a transmission line and an internal resistance of a driver. On the other hand, the crosstalk noise greatly depends on a driving capability of the driver and a gape (pitch) of adjacent wiring patterns.

The noise countermeasures refer to various measures which are taken to suppress various kinds of noise generated in the electronic circuit, based on the results of the noise analysis. Recently, due to the small size and high operation speed of electronic circuits, the noise analysis and the noise countermeasures have become very important when designing the electronic circuit.

The design of the electronic circuit is modified, if necessary, based on the noise countermeasures which are determined. After this design modification, a noise analysis is carried out again, and the procedure described above is repeated until the noise falls within a tolerable range.

According to the conventional electronic circuit design method, if the noise analysis is carried out and a wiring pair where the generated noise exceeds the tolerable range is detected, for example, a designer makes a design modification such as increasing a spacing between the wirings of the wiring pair to correct the wirings, and the noise analysis is carried out again. If the generated noise still exceeds the tolerable range when the noise analysis is carried out again, it is necessary to make a further design modification such as further correcting the wirings. When making the design modification, the designer must specify the modifying contents in detail. However, when the wiring traffic is heavy, it may not be possible to secure all of the specified spacings, and in such a case, the designer specifies the wirings for which the spacings are to be secured based on the designer's experience.

Accordingly, when the generation of the noise exceeding the tolerable range is detected by the noise analysis, the designer must repeat the design modification and the noise analysis a plurality of times, and there was a problem in that it takes time to design the electronic circuit. In addition, the required number of design modifications tends to increase when the designer is inexperienced, and there was another problem in that the dependency on the designer and the load on the designer are both high.

SUMMARY OF THE INVENTION

Accordingly, it is a general object of the present invention to provide a novel and useful electronic circuit design method, simulation apparatus and computer-readable storage medium, in which the problems described above are eliminated.

Another and more specific object of the present invention is to provide an electronic circuit design method, a simulation apparatus and a computer-readable storage medium which can reduce the dependency and the load on the designer, and reduce a design time required to design the electronic circuit.

Still another object of the present invention is to provide an electronic circuit designing method comprising an analyzing step analyzing noise with respect to a wiring pair; and a correcting step automatically correcting the wiring pair by determining a spacing between wirings of the wiring pair so as to prevent generation of a noise error, if the noise error is detected based on the analysis of the noise by the analyzing step. According to the electronic circuit designing method of the present invention, it is possible to reduce the dependency and the load on the designer, and reduce a design time required to design the electronic circuit.

A further object of the present invention is to provide a computer-readable storage medium which stores a program for causing a computer to design an electronic circuit, the program comprising an analyzing procedure causing the computer to analyze noise with respect to a wiring pair; and a correcting procedure causing the computer to automatically correct the wiring pair by determining a spacing between wirings of the wiring pair so as to prevent generation of a noise error, if the noise error is detected based on the analysis of the noise by the analyzing procedure. According to the computer-readable storage medium of the present invention, it is possible to reduce the dependency and the load on the designer, and reduce a design time required to design the electronic circuit.

Another object of the present invention is to provide a simulation apparatus for designing an electronic circuit, comprising analyzing means for analyzing noise with respect to a wiring pair; and correcting means for automatically correcting the wiring pair by determining a spacing between wirings of the wiring pair so as to prevent generation of a noise error, if the noise error is detected based on the analysis of the noise by the analyzing means. According to the simulation apparatus of the present invention, it is possible to reduce the dependency and the load on the designer, and reduce a design time required to design the electronic circuit.

Other objects and further features of the present invention will be apparent from the following detailed description when read in conjunction with the accompanying drawings.

DESCRIPTION OF THE PREFERRED EMBODIMENTS

A description will be given of embodiments of an electronic circuit design method according to the present invention, a simulation apparatus according to the present invention, and a computer-readable storage medium according to the present invention, by referring to the drawings.

First, a description will be given of the simulation apparatus according to the present invention which uses the electronic circuit design method according to the present invention. The simulation apparatus may be formed by an information processing apparatus (computer) shown in FIG. 1. The information processing apparatus shown in FIG. 1 includes a central processing unit (CPU) 91, a memory 92, an input device 93, an output device 94, an external storage unit 95, a medium driving unit 96, and a network connection unit 97 which are connected via a bus 98.

Figure 1:
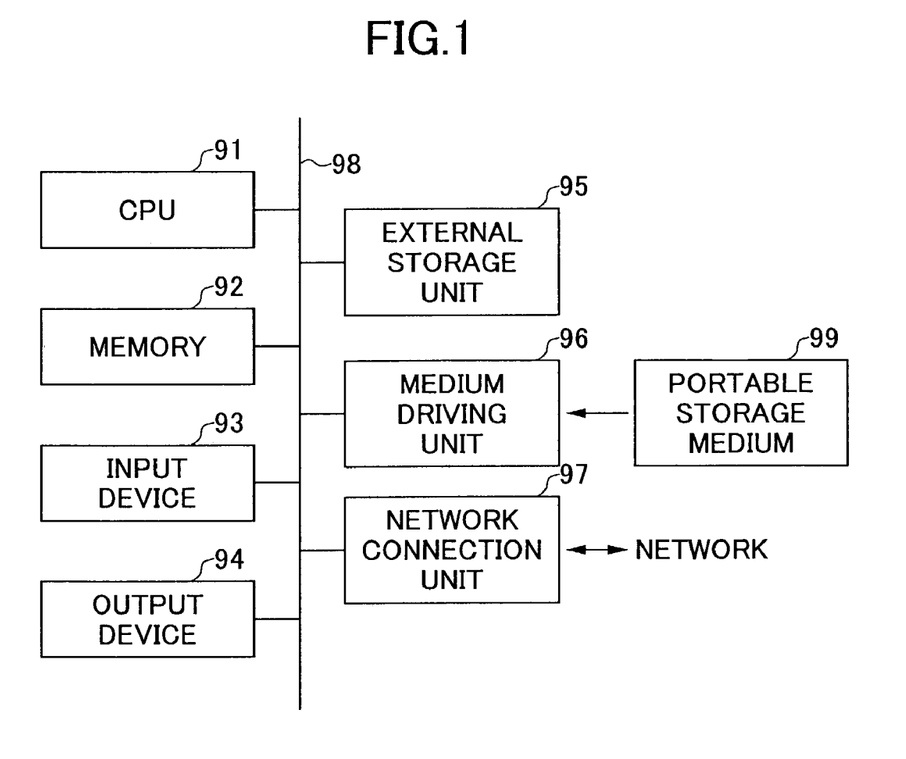
FIG. 1 is a system block diagram showing an information processing apparatus forming a simulation apparatus which uses an electronic circuit design method according to the present invention.

For example, the memory 92 includes a ROM, RAM and the like. The memory 92 stores data and computer programs which are used for various processes. The computer programs include a computer program for causing a computer (CPU 91) to design an electronic circuit by the electronic circuit design method according to the present invention. The CPU 91 executes the computer programs stored in the memory 92 to carry out the various processes.

The input device 93 is formed by a keyboard, a pointing device, a touch panel or the like, and is operated by the user (operator) to input instructions and information. The output device 94 is formed by a display, a printer, a speaker or the like, and is used to output inquiries with respect to the user and results of the processes.

The external storage unit 95 is formed by a magnetic disk unit, an optical disk unit, a magneto-optical disk unit, a tape unit or the like. The information processing apparatus stores the computer programs and the data in the external storage unit 95, and uses the computer programs and the data by loading the computer programs and the data into the memory 92 when necessary.

The medium driving unit 96 drives a portable storage medium 99 and accesses recorded contents of the portable storage medium 99. The portable storage medium 99 is formed by any kind of computer-readable storage medium such as a memory card, a floppy disk, a CD-ROM, an optical disk and a magneto-optical disk. The computer programs and the data are stored in the portable storage medium 99, and the user loads the computer programs and the data into the memory 92 when necessary.

The network connection unit 97 is connected to an arbitrary communication network such as a local area network (LAN) and the Internet, and carries out a data conversion suited for the communication. The information processing apparatus may load the computer programs and the data into the memory 92 from another apparatus via the communication network and the network connection unit 97 when necessary.

Figure 2:
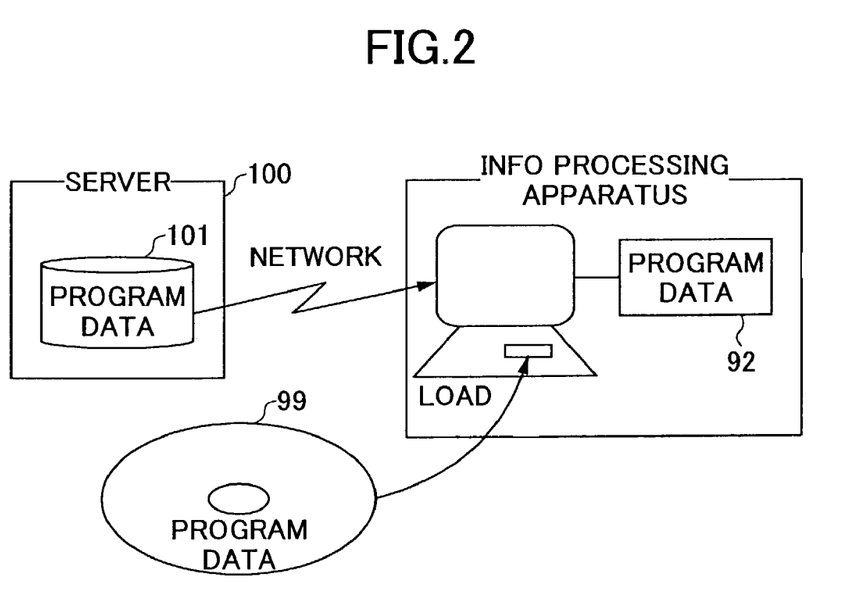
FIG. 2 is a diagram showing a computer-readable storage medium which can supply a computer program and data to the information processing apparatus shown in FIG. 1.

FIG. 2 is a diagram showing a computer-readable storage medium which can supply the computer programs and the data to the information processing apparatus shown in FIG. 1. The computer programs and the data stored in the portable storage medium 99 or a database 101 of a server 100 are loaded into the memory 92. The server 100 generates a carrier signal for carrying the computer programs and the data, and transmits the carrier signal to the information processing apparatus via an arbitrary transmission medium in the communication network. The CPU 91 carries out the necessary processes by executing the computer programs using the carrier signal carrying the computer programs and the data.

Figure 3:
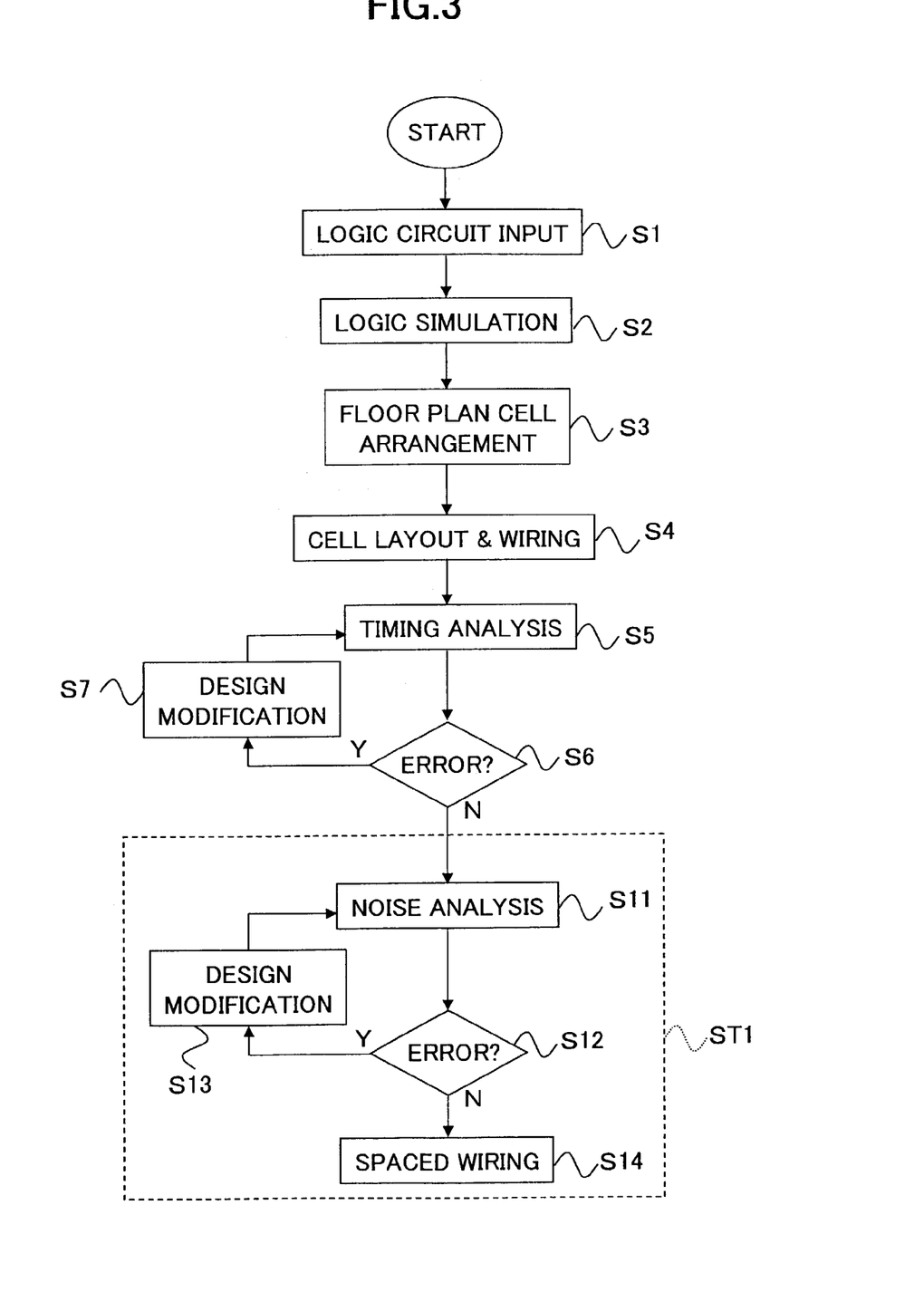
FIG. 3 is a flow chart for explaining the operation of the simulation apparatus.

FIG. 3 is a flow chart for explaining the operation of the simulation apparatus. The process shown in FIG. 3 is carried out when the CPU 91 shown in FIG. 1 executes the computer program for causing the information processing apparatus to design the electronic circuit by the electronic circuit design method according to the present invention. The process shown in FIG. 3 includes a logic design process formed by steps S1 and S2, and a packaging design process formed by steps S3 through S7 and steps S11 through S14.

In FIG. 3, the step S1 inputs a logic circuit of an electronic circuit which is to be designed. The step S2 carries out a logic simulation based on the input logic circuit.

The step S3 arranges cells of a floor plan, and the step S4 determines layout and wiring of the cells. The step S5 carries out a signal timing analysis. The step S6 decides whether or not a timing error is generated. If the decision result in the step S6 is YES, the step S7 makes a design modification based on an instruction input from the user, and the process returns to the step S5. Timing restrictions are made in advance with respect to the electronic circuit which is to be designed, and the step S6 determines that the timing error is generated when the timing restrictions are not satisfied.

If the decision result in the step S6 is NO, the process advances to a wiring rule output process ST1. The wiring rule output process ST1 includes the steps S11 through S14. The step S11 carries out a noise analysis, and the step S12 decides whether or not a noise error is generated as a result of the noise analysis. Noise restrictions are made in advance with respect to the electronic circuit which is to be designed, and the step S12 decides that the noise error is generated when the noise exceeds a tolerable range and the noise restrictions are not satisfied. For example, a check result list is output with respect to a net in which the noise error is generated.

If the decision result in the step S12 is YES, the step S13 makes a design modification based on the check result list, for example, and the process returns to the step S11. The design modification made in the step S13 includes, for example, determining a wiring pair which causes the generation of the noise error and automatically correcting the wirings so as not to generate the noise error by providing a spacing between the wirings of the wiring pair. Accordingly, the step S13 determines the spacing and also automatically creates a wiring rule based on the determined spacing. If the decision result in the step S12 is NO, the step S14 carries out an automatic wiring (spaced wring) with the spacing which does not generate the noise error, according to a wiring rule, using an automatic wiring software (router). Of course, the step S14 may carry out a manual wiring in which the user carries out the wiring manually or, carry out a wiring in which the automatic wiring and the manual wiring coexist.

The present invention is characterized in that the design modification of the step S13 can be made automatically. Hence, the necessary design modification can be made automatically even by an inexperienced designer.

First Embodiment

Figure 4:
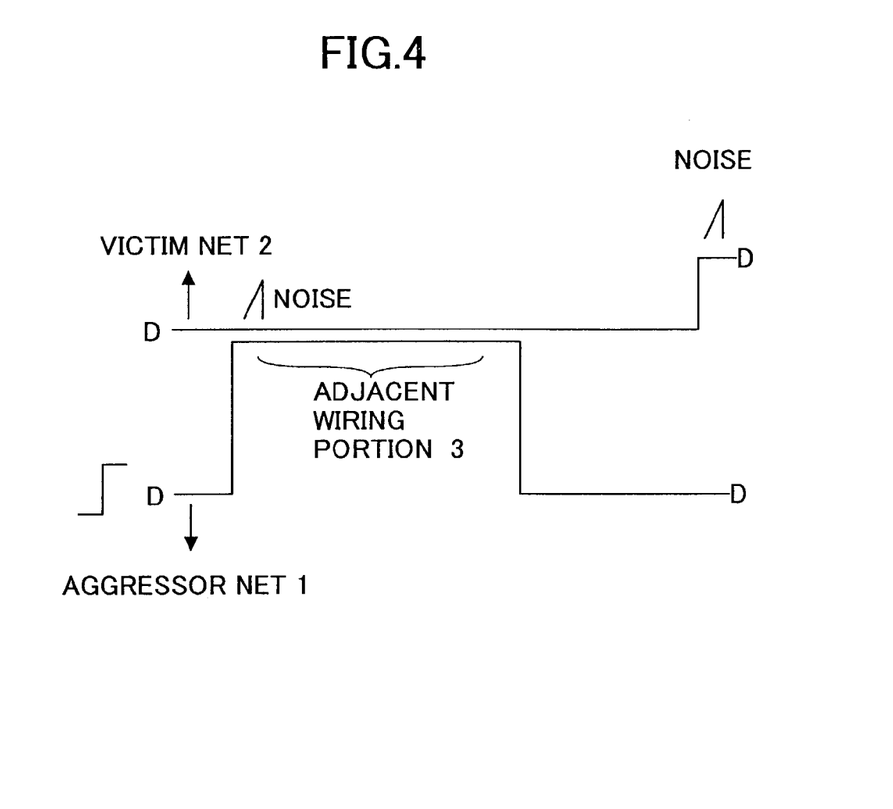
FIG. 4 is a diagram showing a wiring pair which is to be subjected to a design modification in a first embodiment.

FIG. 4 is a diagram showing a wiring pair which is to be subjected to a design modification in a first embodiment. The wiring pair is formed by an aggressor net 1 which becomes a crosstalk noise generating source, and a victim net 2. Crosstalk noise is generated in the victim net 2, because the aggressor net 1 is adjacent to the victim net 2 at an adjacent wiring portion 3.

Figure 5:
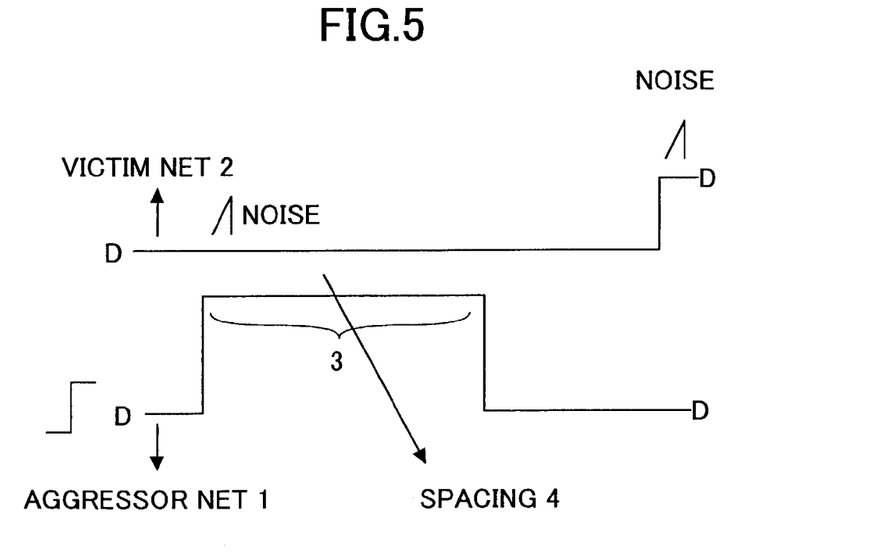
FIG. 5 is a diagram for explaining a design modification which automatically provides a spacing between an aggressor net and a victim net at an adjacent wiring portion.

The crosstalk noise is generated in the victim net 2, because the aggressor net 1 is too close to the victim net 2 at the adjacent wiring portion 3. Hence, the design modification is automatically made, so as to automatically provide a spacing 4 between the aggressor net 1 and the victim net 2 at the adjacent wiring portion 3, as shown in FIG. 5. FIG. 5 is a diagram for explaining the design modification which automatically provides the spacing 4 between the aggressor net 1 and the victim net 2 at the adjacent wiring portion 3.

Figure 6:
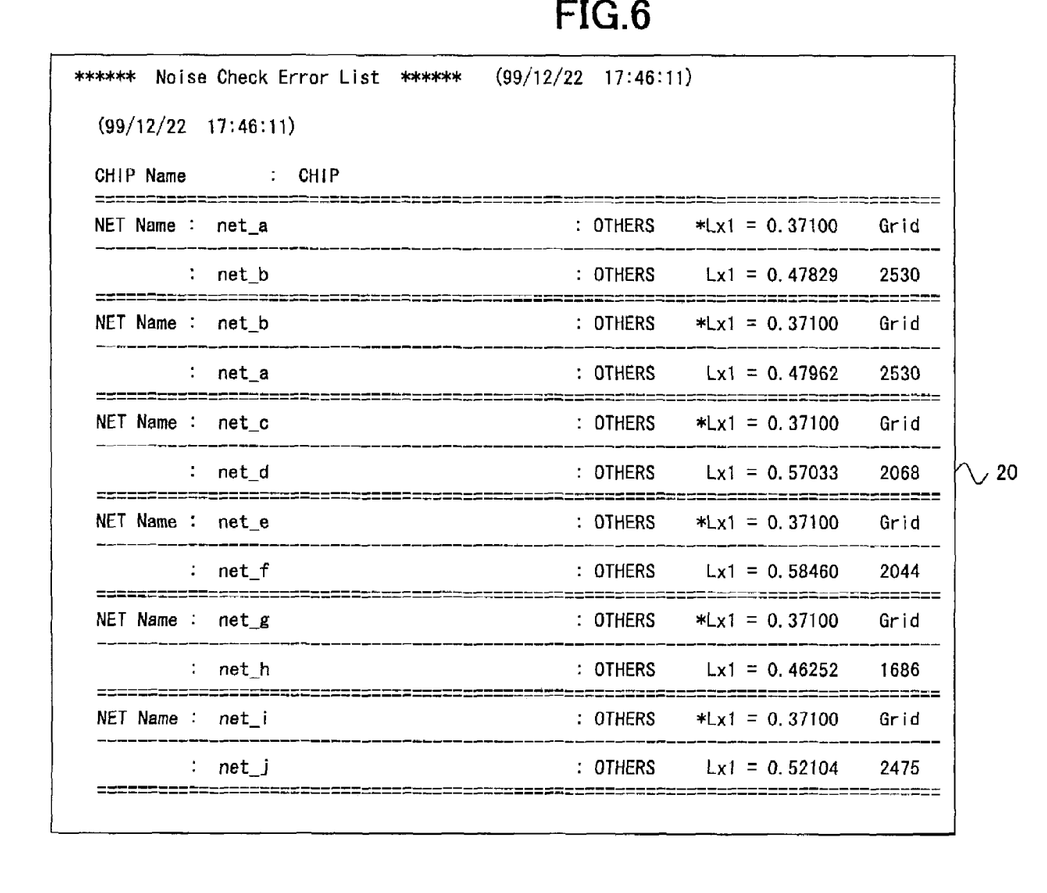
FIG. 6 is a diagram showing a check result list which is output by a step S11 shown in FIG. 3.

FIG. 6 is a diagram showing a check result list 20 which is output by the step S11 shown in FIG. 3. The check result list 20 shown in FIG. 6 includes a victim net in which a noise error is generated, an aggressor net with respect to the victim net, a tolerable noise value of the victim net, a noise value of the aggressor net, a total length of a parallel section, and the like. In FIG. 6, a row above each net name "NET Name" indicates the victim net such as "net_a". In addition, a row below each net name "NET Name" indicates the aggressor net such as "net_b". Furthermore, *Lx1 indicates the tolerable noise value of the victim net, and Lx1 indicates the noise value of the aggressor net. The total length of the parallel section indicates the total longitudinal length for which the adjacent aggressor net 1 and victim net 2 are parallel to each other in the adjacent wiring portion 3.

Figure 7:
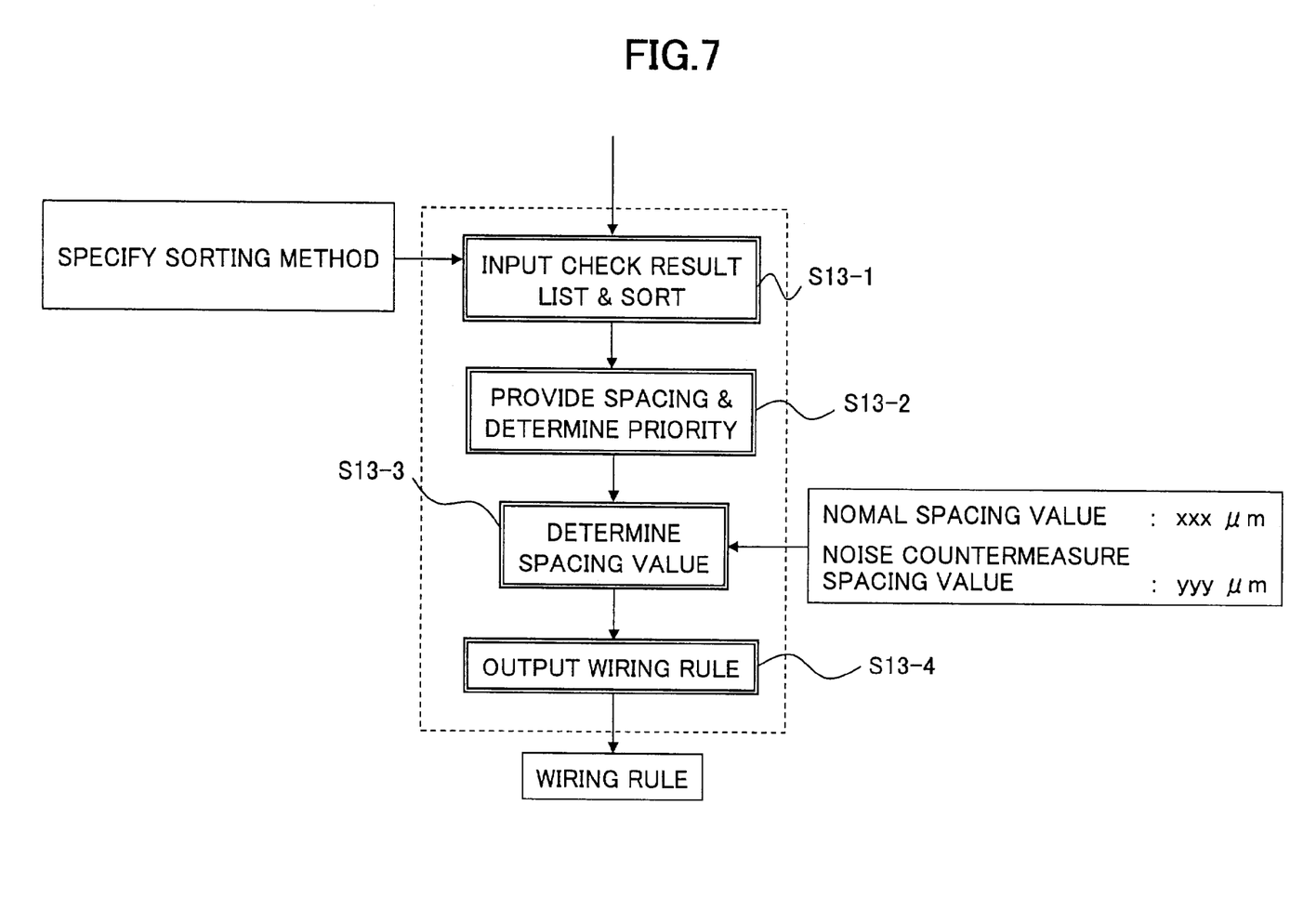
FIG. 7 is a flow chart for explaining an important part of the operation of the first embodiment.

FIG. 7 is a flow chart for explaining an important part of the operation of the first embodiment. The process shown in FIG. 7 corresponds to the step S13 shown in FIG. 3.

In FIG. 7, a step S13-1 inputs the check result list 20, and carries out a sort process to sort contents of the check result list 20. A sorting method used by the sorting process is not limited to a specific sorting method. For example, the sorting process may sort the contents of the check result list 20 based on (1) the victim net and an accumulated length of parallel wirings for the victim net, (2) the victim net and an appearing frequency of the victim net, (3) the aggressor net and an appearing frequency of the aggressor net, (4) an aggressor/victim net which appears as both the victim net and the aggressor net and an appearing frequency of the aggressor/victim net, or the like.

A step S13-2 determines a priority with which the spacing 4 between the aggressor net 1 and the victim net 2 are to be provided at the adjacent wiring portion 3. The priority with which the spacing 4 is provided, refers to a value indicating the net for which the spacing is to be secured with priority over other nets. For example, when the wiring traffic is heavy and the instructed spacing cannot be secured for all of the instructed nets, the priority indicates the net for which the spacing is to be secured with priority over the other nets.

A step S13-3 determines a value (spacing value) of the spacing 4. For example, if a normal spacing value is xxx μm, a noise countermeasure spacing value is determined to yyy μm.

A step S13-4 outputs a wiring rule (rule for each net) at least including the determined spacing value. The wiring rule which is output includes a net name, a tolerable spacing value by which an adjacent net may approach each net, and the like. The wiring rule may include the priority. Accordingly, the step S14 shown in FIG. 3 can carry out the automatic wiring by the router, based on the wiring rule which is output.

Second Embodiment

Figure 8:
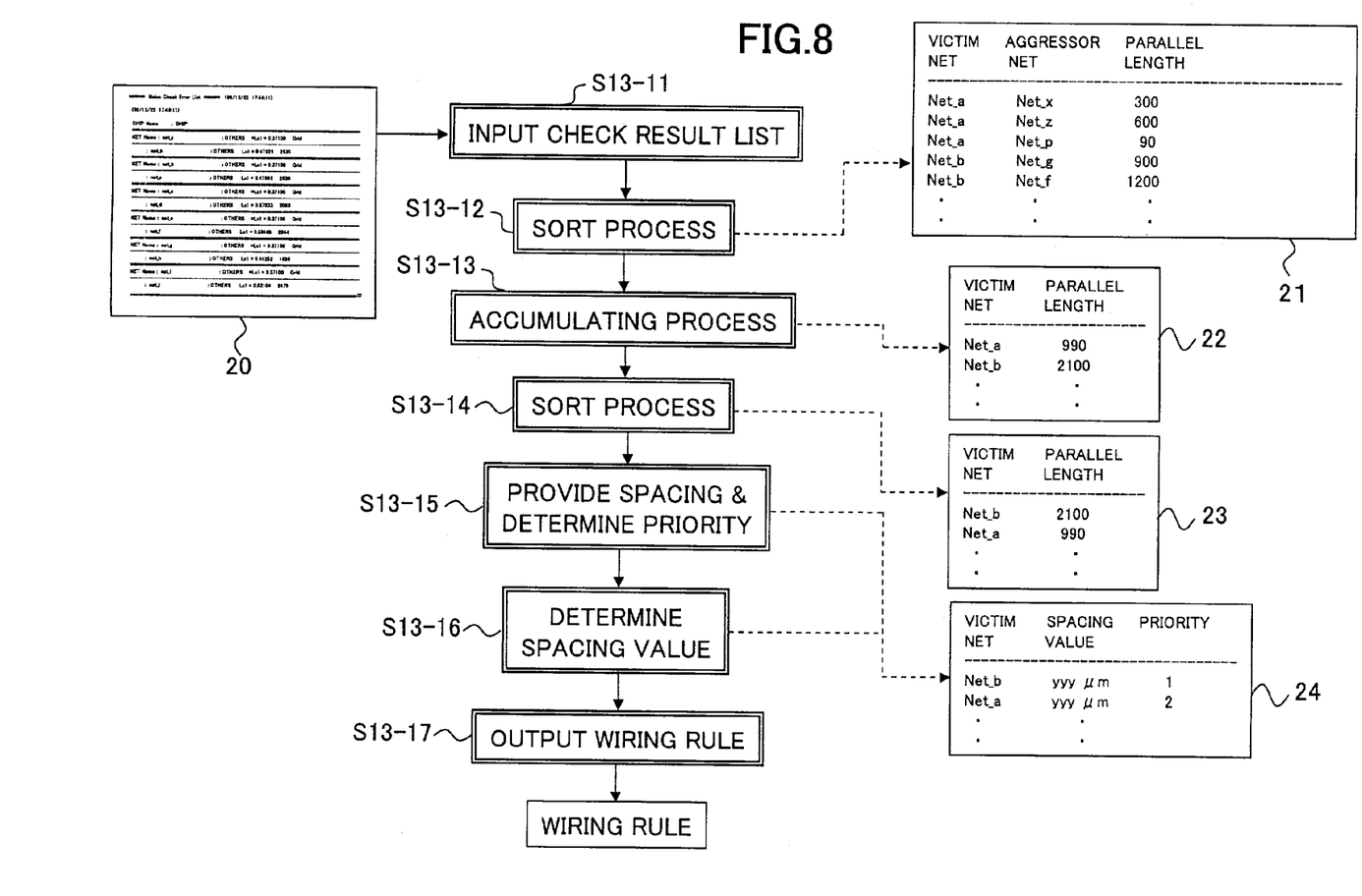
FIG. 8 is a flow chart for explaining an important part of the operation of a second embodiment.

FIG. 8 is a flow chart for explaining an important part of the operation of a second embodiment. The process shown in FIG. 8 corresponds to the step S13 shown in FIG. 3.

In FIG. 8, a step S13-11 inputs the check result list 20 shown in FIG. 6, and a step S13-12 generates a list 21 on the right side of FIG. 8 by carrying out a sort process. The list 21 includes the victim net, the aggressor net, and the length of parallel wirings between the aggressor net and the aggressor net at the adjacent wiring portion. A step S13-13 carries out an accumulating process to obtain the length of parallel wirings with respect to each victim net and to generate a list 22 shown on the right side of FIG. 8. A step S13-14 carries out a sort process with respect to the list 22, and generates a list 23 shown on the right side of FIG. 8. For example, the contents of the list 22 are sorted in an order starting from the largest length of parallel wirings. In this sort process, the spacing is secured with respect to one net, so that the priority is determined in an order having the highest possibility of eliminating more noise error.

A step S13-15 determines the priority with which the spacing is provided between the aggressor net and the victim net at the adjacent wiring portion, based on the list 23. In addition, a step S14-16 determines the spacing value. A list 24 shown on the right side of FIG. 8 is generated by the steps S13-15 and S13-16. The list 24 includes the spacing value and the priority with respect to each victim net. For example, the spacing value is yyy μm and the priority is 1 with respect to the victim net Net_b. In this case, it is assumed for the sake of convenience that, the smaller priority value, the higher the priority.

A step S13-17 outputs a wiring rule (rule for each net) including the determined spacing value and priority, based on the list 24. The wiring rule which is output includes the net name, the tolerable spacing value by which the adjacent net may approach each net, the priority, and the like. Accordingly, the step S14 shown in FIG. 3 can carry out the automatic wiring by the router, based on the wiring rule which is output.

Third Embodiment

Figure 9:
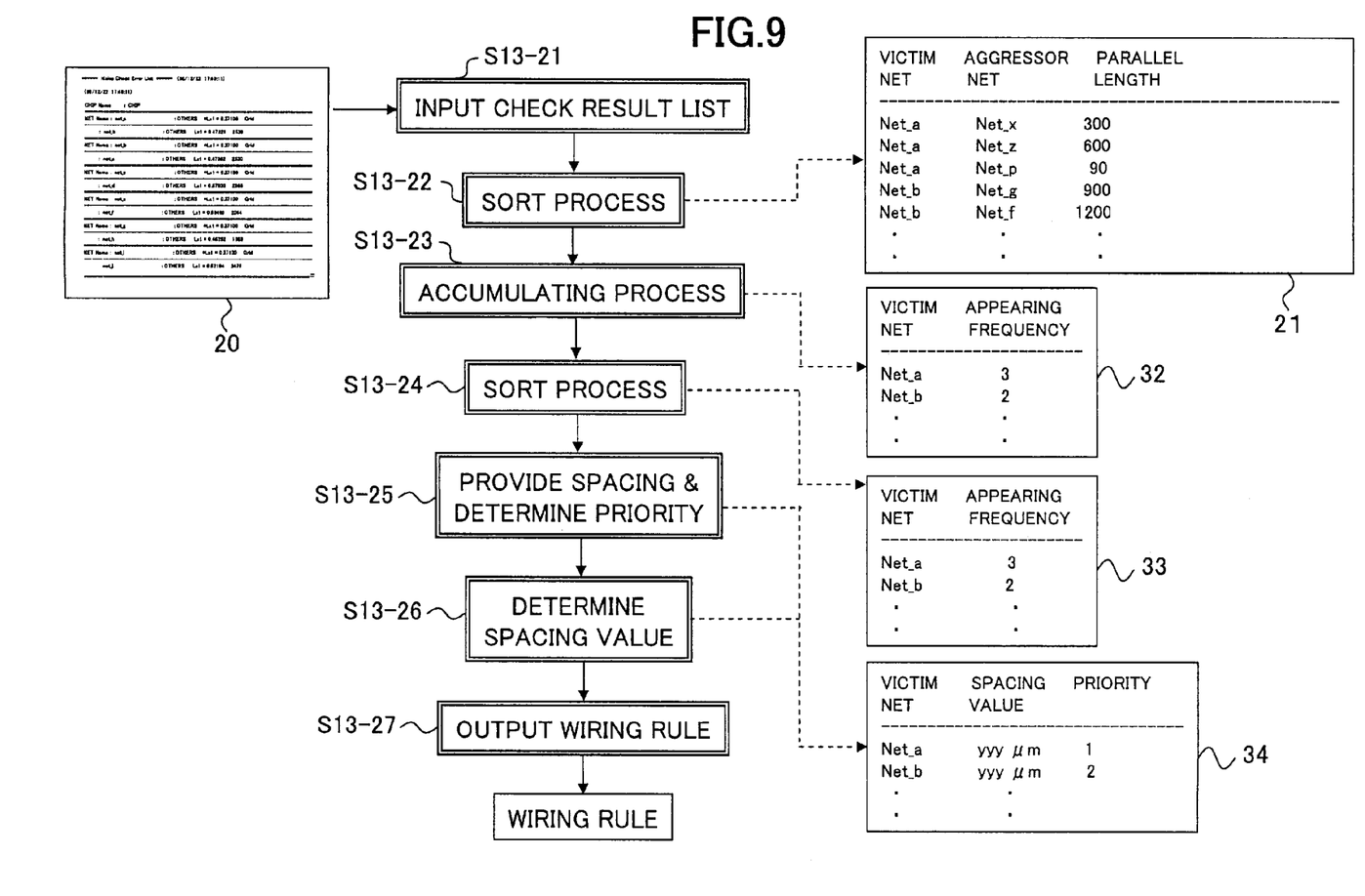
FIG. 9 is a flow chart for explaining an important part of the operation of a third embodiment.

FIG. 9 is a flow chart for explaining an important part of the operation of a third embodiment. The process shown in FIG. 9 corresponds to the step S13 shown in FIG. 3.

In FIG. 9, a step S13-21 inputs the check result list 20 shown in FIG. 6, and a step S13-22 generates a list 21 on the right side of FIG. 9 by carrying out a sort process. The list 21 includes the victim net, the aggressor net, and the length of parallel wirings between the aggressor net and the aggressor net at the adjacent wiring portion. A step S13-23 carries out an accumulating process to obtain the appearing frequency of each victim net in the list 21 and to generate a list 32 shown on the right side of FIG. 9. A step S13-24 carries out a sort process with respect to the list 32, and generates a list 33 shown on the right side of FIG. 9. For example, the contents of the list 32 are sorted in an order starting from the highest appearing frequency. In this sort process, the spacing is secured with respect to one net, so that the priority is determined in an order having the highest possibility of remedying (or eliminating) more victim nets.

A step S13-25 determines the priority with which the spacing is provided between the aggressor net and the victim net at the adjacent wiring portion, based on the list 33. In addition, a step S14-26 determines the spacing value. A list 34 shown on the right side of FIG. 9 is generated by the steps S13-25 and S13-26. The list 34 includes the spacing value and the priority with respect to each victim net. For example, the spacing value is yyy μm and the priority is 2 with respect to the victim net Net_b. In this case, it is assumed for the sake of convenience that, the smaller priority value, the higher the priority.

A step S13-27 outputs a wiring rule (rule for each net) including the determined spacing value and priority, based on the list 34. The wiring rule which is output includes the net name, the tolerable spacing value by which the adjacent net may approach each net, the priority, and the like. Accordingly, the step S14 shown in FIG. 3 can carry out the automatic wiring by the router, based on the wiring rule which is output.

Fourth Embodiment

Figure 10:
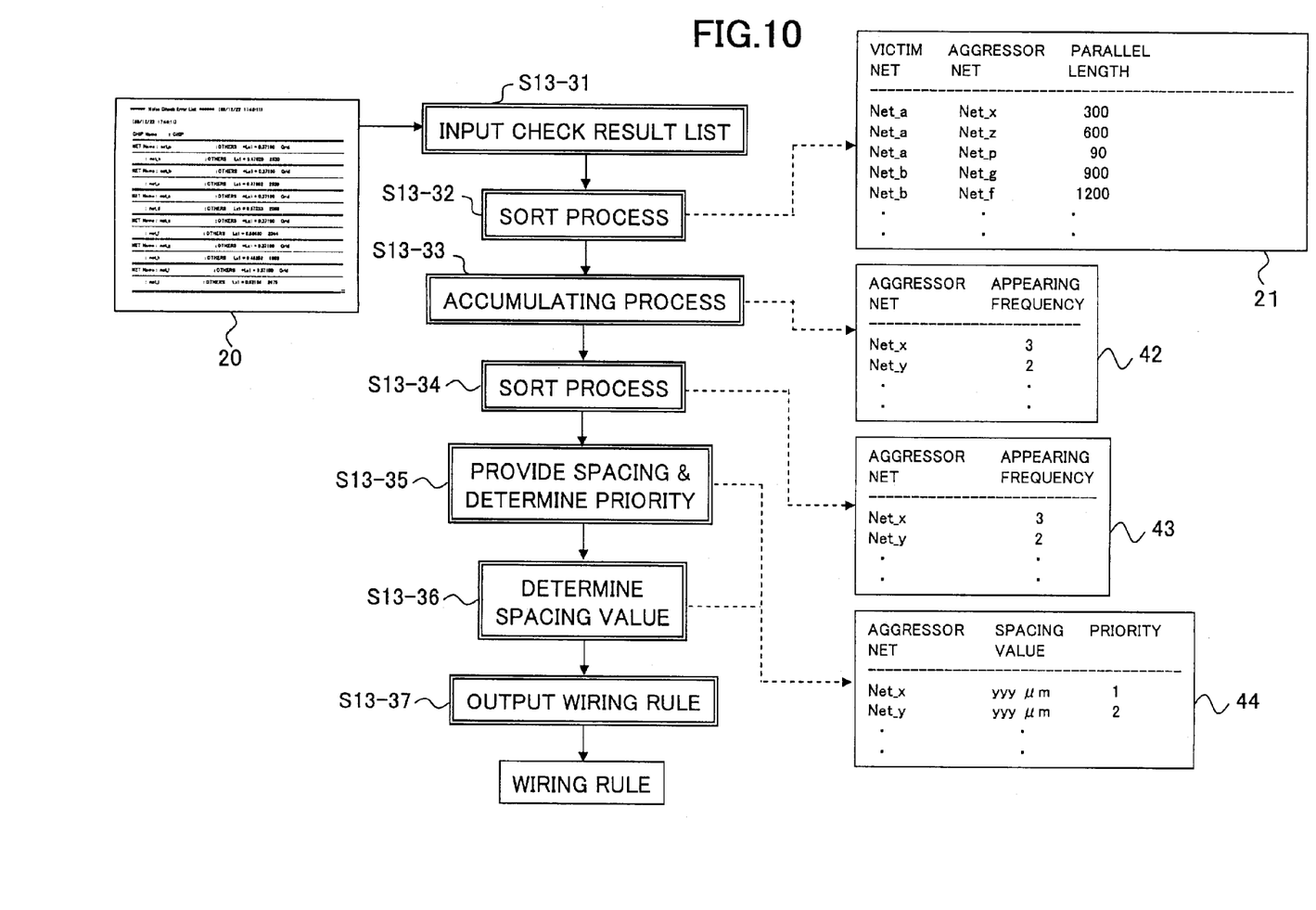
FIG. 10 is a flow chart for explaining an important part of the operation of a fourth embodiment.

FIG. 10 is a flow chart for explaining an important part of the operation of a fourth embodiment. The process shown in FIG. 10 corresponds to the step S13 shown in FIG. 3.

In FIG. 10, a step S13-31 inputs the check result list 20 shown in FIG. 6, and a step S13-32 generates a list 21 on the right side of FIG. 10 by carrying out a sort process. The list 21 includes the victim net, the aggressor net, and the length of parallel wirings between the aggressor net and the aggressor net at the adjacent wiring portion. A step S13-33 carries out an accumulating process to obtain the appearing frequency of each victim net in the list 21 and to generate a list 42 shown on the right side of FIG. 10. A step S13-34 carries out a sort process with respect to the list 42, and generates a list 43 shown on the right side of FIG. 10. For example, the contents of the list 42 are sorted in an order starting from the highest appearing frequency. In this sort process, the spacing is secured with respect to one net, so that the priority is determined in an order having the highest possibility of remedying (or eliminating) more aggressor nets, so as to suppress the nets from becoming the aggressor nets.

A step S13-35 determines the priority with which the spacing is provided between the aggressor net and the victim net at the adjacent wiring portion, based on the list 43. In addition, a step S14-36 determines the spacing value. A list 44 shown on the right side of FIG. 10 is generated by the steps S13-35 and S13-36. The list 44 includes the spacing value and the priority with respect to each aggressor net. For example, the spacing value is yyy μm and the priority is 1 with respect to the aggressor net Net_b. In this case, it is assumed for the sake of convenience that, the smaller priority value, the higher the priority.

A step S13-37 outputs a wiring rule (rule for each net) including the determined spacing value and priority, based on the list 44. The wiring rule which is output includes the net name, the tolerable spacing value by which the adjacent net may approach each net, the priority, and the like. Accordingly, the step S14 shown in FIG. 3 can carry out the automatic wiring by the router, based on the wiring rule which is output.

Fifth Embodiment

Figure 11:
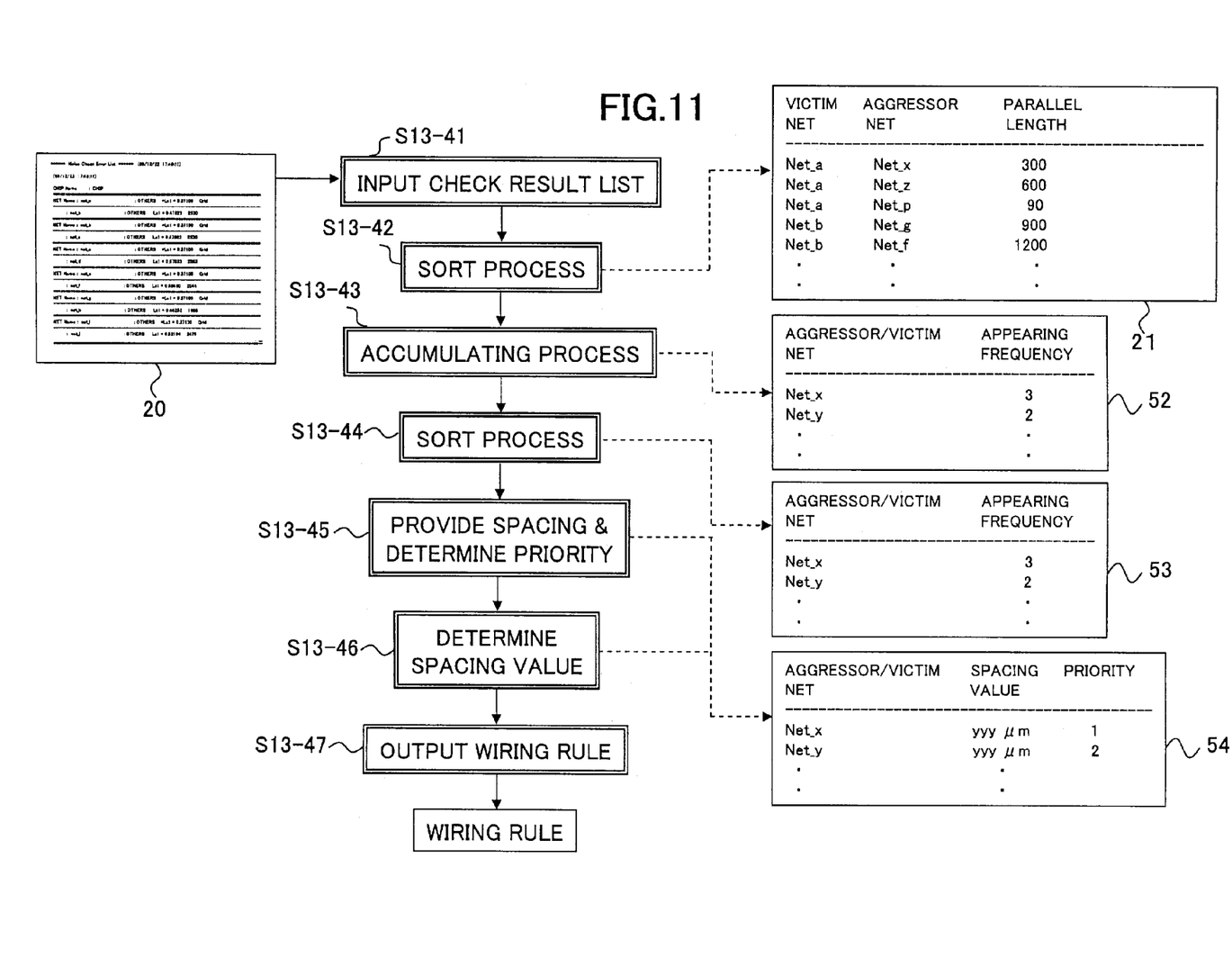
FIG. 11 is a flow chart for explaining an important part of the operation of a fifth embodiment.

FIG. 11 is a flow chart for explaining an important part of the operation of a fifth embodiment. The process shown in FIG. 11 corresponds to the step S13 shown in FIG. 3.

In FIG. 11, a step S13-41 inputs the check result list 20 shown in FIG. 6, and a step S13-42 generates a list 21 on the right side of FIG. 11 by carrying out a sort process. The list 21 includes the victim net, the aggressor net, and the length of parallel wirings between the aggressor net and the aggressor net at the adjacent wiring portion. A step S13-43 carries out an accumulating process to obtain the appearing frequency of each aggressor/victim net which appears as both the aggressor net and the victim net in the list 21 and to generate a list 52 shown on the right side of FIG. 11. A step S13-44 carries out a sort process with respect to the list 52, and generates a list 53 shown on the right side of FIG. 11. For example, the contents of the list 52 are sorted in an order starting from the highest appearing frequency. In this sort process, the spacing is secured with respect to one net, so that the priority is determined in an order having the highest possibility of remedying (or eliminating) more aggressor/victim nets, so as to suppress the nets from becoming the aggressor/victim nets.

A step S13-45 determines the priority with which the spacing is provided between the aggressor net and the victim net at the adjacent wiring portion, based on the list 53. In addition, a step S14-46 determines the spacing value. A list 54 shown on the right side of FIG. 11 is generated by the steps S13-45 and S13-46. The list 54 includes the spacing value and the priority with respect to each aggressor/victim net. For example, the spacing value is yyy μm and the priority is 2 with respect to the aggressor/victim net Net_y. In this case, it is assumed for the sake of convenience that, the smaller priority value, the higher the priority.

A step S13-47 outputs a wiring rule (rule for each net) including the determined spacing value and priority, based on the list 54. The wiring rule which is output includes the net name, the tolerable spacing value by which the adjacent net may approach each net, the priority, and the like. Accordingly, the step S14 shown in FIG. 3 can carry out the automatic wiring by the router, based on the wiring rule which is output.

Sixth Embodiment

In the crosstalk analysis, a peak noise value of a gate input can be represented by a formula. Various crosstalk models exist, and various analyzing techniques exist therefor. Accordingly, the formula for obtaining the peak noise value cannot be uniquely determined. For example, "Analysis, Reduction and Avoidance of Crosstalk on VLSI Chips", IBM International Symposium on Physical Design, 1998 proposes a formula for obtaining the peak noise value based on the following crosstalk model.

Figure 12:
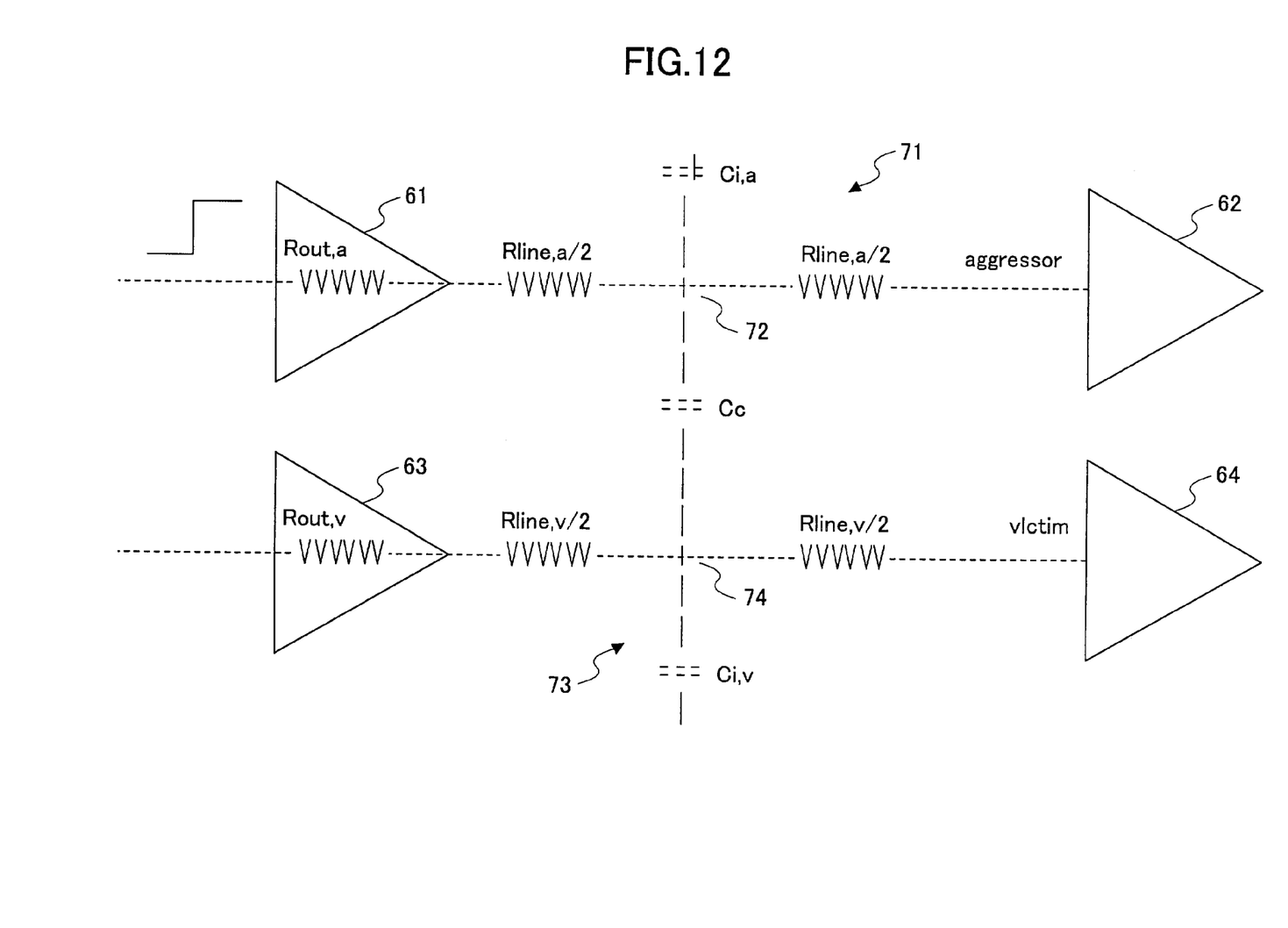
FIG. 12 is a diagram for explaining a crosstalk model used in a sixth embodiment.

FIG. 12 is a diagram for explaining a crosstalk model used in a sixth embodiment. In FIG. 12, an aggressor net 71 includes a driver 61, a wiring 72 and a receiver 62. On the other hand, a victim net 73 includes a driver 63, a wiring 74 and a receiver 64. A peak noise value $V_{peak}$ can be described by the following formula (1), where Vdd denotes a power supply voltage, $R_{out,a}$ denotes an output resistance of the driver 61, $R_{out,v}$ denotes an output resistance of the driver 63, $C_{i,a}$ denotes an intrinsic capacitance of the wiring 72, $C_{i,v}$ denotes an intrinsic capacitance of the wiring 74, $C_c$ denotes a coupling capacitance between the wirings 72 and 74, $R_{line,a}$ denotes a wiring length resistance of the wiring 72, and $R_{line,v}$ denotes a wiring length resistance of the wiring 74.

$$V_{peak} = Vdd/[\{(R_{out,a} \times C_{i,a})/\{(R_{out,v}+R_{line,v}/2) \times C_c\} + (C_{i,v}/C_c)\}] \quad (1)$$

The peak noise value $V_{peak}$ described by the formula (1) can generally be described by the following formula (2) by a function of an aggressor side driver resistance Ra, a victim side driver resistance Rv, a wiring resistance r, a wiring capacitance c, a parallel (longitudinal) wiring length L and a coupling capacitance $C_c$ between adjacent wirings.

$$V_{peak} = f1(Ra, Rv, r, c, L, C_c) \quad (2)$$

In addition, the wiring resistance r and the wiring capacitance c can be described as a function of the parallel (longitudinal) wiring length L, as may be seen from the following formulas (3) and (4).

$$r = f2(L) \quad (3)$$

$$c = f3(L) \quad (4)$$

When the formulas (3) and (4) are substituted into the formula (2), the peak noise value $V_{peak}$ can be described by a function of the parallel (longitudinal) wiring length L and the coupling capacitance $C_c$ between adjacent wirings.

$$V_{peak} = f4(Ra, Rv, L, Cc) \quad (5)$$

From the formula (5), the condition for suppressing the peak noise value $V_{peak}$ to 1/N the power supply voltage Vdd can be described by the following formula (6).

$$V_{peak} = f4(Ra, Rv, L, C_c) \leq Vdd/N \quad (6)$$

From the formula (6), the parallel (longitudinal) wiring length L can be described by the following formula (7).

$$L \leq f5(Ra, Rv, C_c, Vdd, N) \quad (7)$$

In the formula (7), Vdd and N are fixed. Hence, the tolerable parallel (longitudinal) wiring length L can be determined by the following relationship (8) based on the aggressor side driver resistance Ra, the victim side driver resistance Rv, and the coupling capacitance $C_c$ between two adjacent wirings.

$$L \leq f6(Ra, Rv, C_c) \quad (8)$$

In the sixth embodiment, the step S12 shown in FIG. 3 judges the noise error in the following manner. That is, when checking the crosstalk noise, the coupling capacitance $C_c$ between two nets is obtained, and the tolerable parallel (longitudinal) wiring length L is obtained from the formula (8) using the aggressor side driver resistance Ra and the victim side driver resistance Rv. The step S12 judges that the noise error is generated by the crosstalk noise if the actual parallel (longitudinal) wiring length of two wirings at the adjacent wiring portion exceeds the tolerable parallel (longitudinal) wiring length L. The parallel (longitudinal) wiring length refers to the longitudinal length for which the two wirings run parallel to each other.

Further, the present invention is not limited to these embodiments, but various variations and modifications may be made without departing from the scope of the present invention.

What is claimed is:

1. An electronic circuit designing method comprising:
   an analyzing step analyzing noise with respect to a wiring pair; and
   a correcting step automatically correcting the wiring pair by determining a spacing between wirings of the wiring pair so as to prevent generation of a noise error, if the noise error is detected based on the analysis of the noise by said analyzing step,
   wherein said analyzing step detects a noise error if a parallel wiring length for which adjacent wirings of a victim net and an aggressor net are parallel to each other in an adjacent wiring portion between the victim net and the aggressor net exceeds a tolerable parallel wiring length L described by:

$$L \leq f6(Ra, Rv, Cc)$$

where Ra denotes an aggressor side driver resistance, Rv denotes a victim side driver resistance, and Cc denotes a coupling capacitance between two adjacent wirings.

2. The electronic circuit designing method as claimed in claim 1, wherein said correcting step creates a wiring rule based on the spacing which is determined.

3. The electronic circuit designing method as claimed in claim 2, further comprising:
   a wiring step carrying out a wiring, with the spacing which prevents generation of the noise error, according to the wiring rule, using an automatic wiring software.

4. The electronic circuit designing method as claimed in claim 1, wherein said analyzing step outputs, upon detecting the noise error, a check result list including an aggressor net, a victim net, a tolerable noise value of the victim net, a noise value of the aggressor net, and a parallel wiring length for which adjacent wirings of the victim net and the aggressor net are parallel to each other in an adjacent wiring portion between the victim net and the aggressor net.

5. The electronic circuit designing method as claimed in claim 4, wherein said correcting step includes:
   sorting the check result list;
   determining a priority with which the spacing between the aggressor net and the victim net is to be provided at the adjacent wiring portion;
   determining a spacing value of the spacing; and
   outputting the wiring rule including at least the spacing value which is determined.

6. The electronic circuit designing method as claimed in claim 5, wherein said wiring rule includes a net name, a tolerable spacing value by which an adjacent net may approach each net, and/or the priority.

7. An electronic circuit designing method comprising:
   an analyzing step analyzing noise with respect to a wiring pair; and
   a correcting step automatically correcting the wiring pair by determining a spacing between wirings of the wiring pair so as to prevent generation of a noise error, if the noise error is detected based on the analysis of the noise by said analyzing step,
   wherein said analyzing step outputs, upon detecting the noise error, a check result list including an aggressor net, a victim net, a tolerable noise value of the victim net, a noise value of the aggressor net, and a parallel wiring length for which adjacent wirings of the victim net and the aggressor net are parallel to each other in an adjacent wiring portion between the victim net and the aggressor net wherein said correcting step includes:
sorting the check result list;
determining a priority with which the spacing between the aggressor net and the victim net is to be provided at the adjacent wiring portion;
determining a spacing value of the spacing; and
outputting the wiring rule including at least the spacing value which is determined,
wherein said correcting step sorts the check result list based on the victim net and an accumulated length of parallel wirings for the victim net, the victim net and an appearing frequency of the victim net, the aggressor net and an appearing frequency of the aggressor net, or an aggressor/victim net which appears as both the victim net and the aggressor net and an appearing frequency of the aggressor/victim net.

8. A computer-readable storage medium which stores a program for causing a computer to design an electronic circuit, said program comprising:
an analyzing procedure causing the computer to analyze noise with respect to a wiring pair; and
a correcting procedure causing the computer to automatically correct the wiring pair by determining a spacing between wirings of the wiring pair so as to prevent generation of a noise error, if the noise error is detected based on the analysis of the noise by said analyzing procedure,
wherein said analyzing procedure causes the computer to detect a noise error if a parallel wiring length for which adjacent wirings of a victim net and an aggressor net are parallel to each other in an adjacent wiring portion between the victim net and the aggressor net exceeds a tolerable parallel wiring length L described by:

$$L \leq f6(Ra, Rv, Cc)$$

where Ra denotes an aggressor side driver resistance, Rv denotes a victim side driver resistance, and Cc denotes a coupling capacitance between two adjacent wirings.

9. The computer-readable storage medium as claimed in claim 8, wherein said correcting procedure causes the computer to create a wiring rule based on the spacing which is determined.

10. The computer-readable storage medium as claimed in claim 9, wherein said program further comprising:
a wiring procedure causing the computer to carry out a wiring, with the spacing which prevents generation of the noise error, according to the wiring rule, using an automatic wiring software.

11. The computer-readable storage medium as claimed in claim 8, wherein said analyzing procedure causes the computer to output, upon detecting the noise error, a check result list including an aggressor net, a victim net, a tolerable noise value of the victim net, a noise value of the aggressor net, and a parallel wiring length for which adjacent wirings of the victim net and the aggressor net are parallel to each other in an adjacent wiring portion between the victim net and the aggressor net.

12. The computer-readable storage medium as claimed in claim 11, wherein said correcting procedure includes causing the computer to:
sort the check result list;
determine a priority with which the spacing between the aggressor net and the victim net is to be provided at the adjacent wiring portion;
determine a spacing value of the spacing; and output the wiring rule including at least the spacing value which is determined.

13. The computer-readable storage medium as claimed in claim 12, wherein said wiring rule includes a net name, a tolerable spacing value by which an adjacent net may approach each net, and/or the priority.

14. A computer-readable storage medium which stores a program for causing a computer to design an electronic circuit, said program comprising:
an analyzing procedure causing the computer to analyze noise with respect to a wiring pair; and
a correcting procedure causing the computer to automatically correct the wiring pair by determining a spacing between wirings of the wiring pair so as to prevent generation of a noise error, if the noise error is detected based on the analysis of the noise by said analyzing procedure
wherein said analyzing procedure causes the computer to output, upon detecting the noise error, a check result list including an aggressor net, a victim net, a tolerable noise value of the victim net, a noise value of the aggressor net, and a parallel wiring length for which adjacent wirings of the victim net and the aggressor net are parallel to each other in an adjacent wiring portion between the victim net and the aggressor net
wherein said correcting procedure includes causing the computer to:
sort the check result list;
determine a priority with which the spacing between the aggressor net and the victim net is to be provided at the adjacent wiring portion;
determine a spacing value of the spacing; and output the wiring rule including at least the spacing value which is determined,
wherein said correcting procedure causes the computer to sort the check result list based on the victim net and an accumulated length of parallel wirings for the victim net, the victim net and an appearing frequency of the victim net, the aggressor net and an appearing frequency of the aggressor net, or an aggressor/victim net which appears as both the victim net and the aggressor net and an appearing frequency of the aggressor/victim net.

15. A simulation apparatus for designing an electronic circuit, comprising:
analyzing means for analyzing noise with respect to a wiring pair; and
correcting means for automatically correcting the wiring pair by determining a spacing between wirings of the wiring pair so as to prevent generation of a noise error, if the noise error is detected based on the analysis of the noise by said analyzing means,
wherein said analyzing step detects a noise error if a parallel wiring length for which adjacent wirings of a victim net and an aggressor net are parallel to each other in an adjacent wiring portion between the victim net and the aggressor net exceeds a tolerable parallel wiring length L described by:

$$L \leq f6(Ra, Rv, Cc)$$

where Ra denotes an aggressor side driver resistance, Rv denotes a victim side driver resistance, and Cc denotes a coupling capacitance between two adjacent wirings.

* * * * *